United States Patent [19]

Nakatsui et al.

[11] Patent Number: 4,682,019
[45] Date of Patent: Jul. 21, 1987

[54] AMORPHOUS SILICON PHOTOELECTRIC TRANSDUCER WITH A PHOTOCONDUCTIVE COLORANT LAYER

[75] Inventors: Hisashi Nakatsui; Hiroyuki Imataki, both of Kawasaki; Yoshioki Hajimoto, Yokohama, all of Japan

[73] Assignee: Canon Kabushiki Kaisha, Tokyo, Japan

[21] Appl. No.: 831,116

[22] Filed: Feb. 20, 1986

Related U.S. Application Data

[63] Continuation of Ser. No. 735,511, May 20, 1985, which is a continuation of Ser. No. 344,799, Feb. 1, 1982, abandoned.

[30] Foreign Application Priority Data

Feb. 9, 1981 [JP] Japan .................................. 56-17752

[51] Int. Cl.[4] .............................................. H01L 31/04
[52] U.S. Cl. .................................. 250/211 R; 357/2; 357/30; 430/58; 430/66
[58] Field of Search ..................... 250/211 J, 211 R; 357/2, 30; 136/258; 430/84, 58, 61, 66

[56] References Cited

U.S. PATENT DOCUMENTS

| | | | |
|---|---|---|---|
| 4,217,148 | 8/1980 | Carlson | 357/2 X |
| 4,222,902 | 9/1980 | Huffman et al. | 430/61 |
| 4,354,104 | 10/1982 | Chikamura et al. | 250/578 X |
| 4,360,821 | 11/1982 | Tsukada et al. | 357/2 X |
| 4,447,720 | 5/1984 | Ogawa et al. | 250/578 X |

Primary Examiner—Edward P. Westin
Attorney, Agent, or Firm—Fitzpatrick, Cella, Harper & Scinto

[57] ABSTRACT

A photoelectric transducer contains a substrate, a photoconductive layer mainly composed of amorphous silicon and a colorant layer.

4 Claims, 6 Drawing Figures

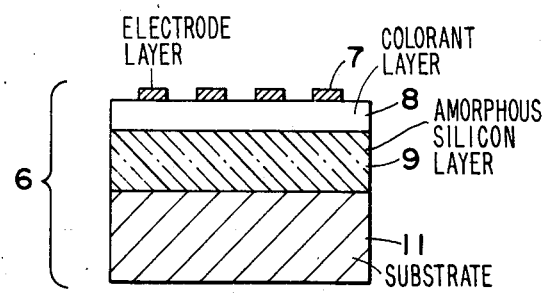
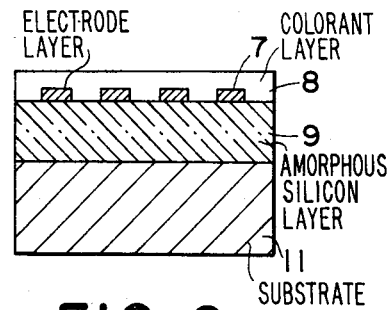
FIG. 1  FIG. 2
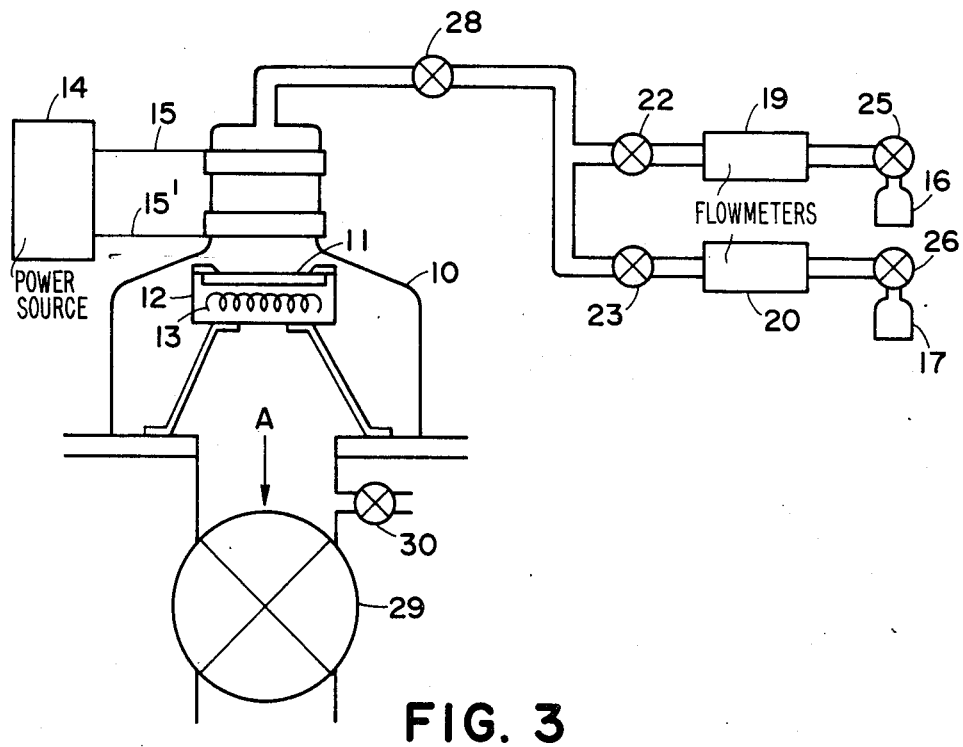
FIG. 3

AMORPHOUS SILICON PHOTOELECTRIC TRANSDUCER WITH A PHOTOCONDUCTIVE COLORANT LAYER

This application is a continuation of application Ser. No. 735,511 filed May, 20, 1985, which, in turn, is a continuation of Ser. No. 344,799 filed Feb. 1, 1982, now abandoned.

BACKGROUND OF THE INVENTION

1. Field of the Invention

This invention relates to a semiconductor photoelectric transducer, and more particularly, to a semiconductor photoelectric transducer having a spectral sensitivity selectively in the visible light wavelength region.

2. Description of the Prior Art

Heretofore, semiconductor photoelectric transducers having a spectral sensitivity selectively in the visible light wavelength region have been prepared by various methods as shown below. For example, cadmium sulfide is doped with an acceptor impurity composed of a metal element of Group I of the Periodic Table such as copper and the like by using cadmium chloride as a flux to impart selectively a spectral sensitivity at the visible light wavelength region. In the case of zinc oxide, an organic colorant is adsorbed to zinc oxide to impart selectively a spectral sensitivity corresponding to the light absorption of the adsorbed colorant.

In addition, it is also well known that silver halides are sensitized with cyanine dyes and xanthene dyes so as to impart a spectral sensitivity at the long wave length region.

As a material for semiconductor photoelectric transducers, there may be mentioned Group II–VI compounds such as CdS, CdSe, CdTe, ZnO, ZnS, ZnSe, ZnTe and the like, Group III–V compounds such as GaP, InSb and the like, of Group IV such as Ge, Si and the like, and organic photo-conductive materials. Among them, Group II–VI compounds are preferable. Silicon has been recently used in a great amount because silicon resources are very rich.

It has been heretofore known that photoconductivity is often observed when organic colorants are selectively irradiated with a visible light. However, such conventional organic colorants generally have a low sensitivity and the time required for rise and decay (response time) of photocurrent is as long as from several minutes to several tens minutes and therefore, it is difficult to use conventional organic colorants as a practical photoelectric transducer.

SUMMARY OF THE INVENTION

An object of the present invention is to provide a photoelectric transducer free from the above mentioned drawbacks.

Another object of the present invention is to provide a photoelectric transducer capable of being easily fabricated, excellent in reproducibility, having high specific sensitivity and from which a large electric current can be obtained.

According to the present invention, there is provided a photoelectric transducer which comprises a substrate, a photoconductive layer mainly composed of amorphous silicon (hereinafter referred to as "a-Si") and a colorant layer.

BRIEF DESCRIPTION OF THE DRAWING

FIGS. 1 and 2 show diagrammatically cross sections of embodiments of photoelectric transducer according to the present invention;

FIG. 3 is an example of an apparatus for producing the photoelectric transducer.

DESCRIPTION OF THE PREFERRED EMBODIMENTS

Figure 5:
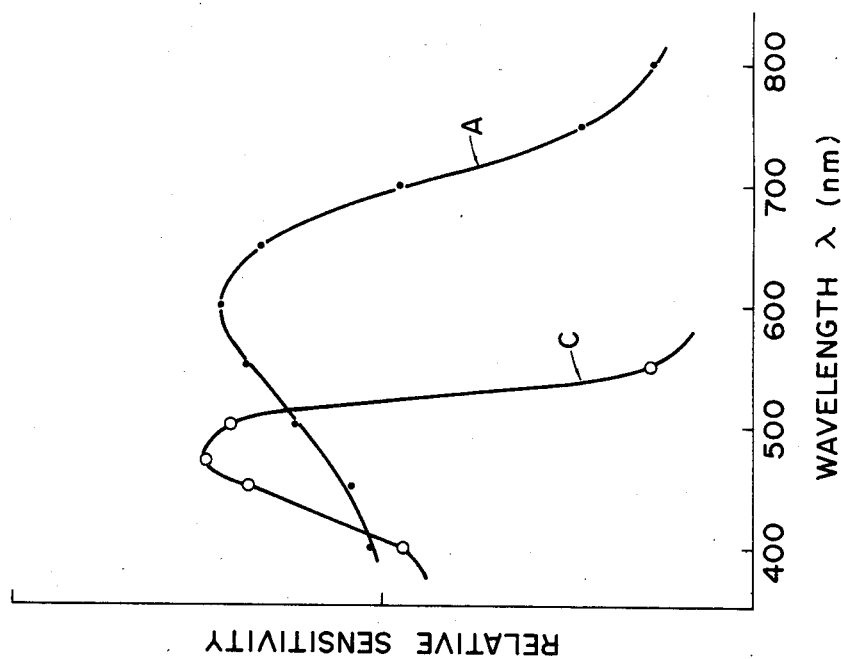
FIGS. 4–6 show the results of working examples.

One preferable embodiment of the photoelectric transducer of the present invention comprises a substrate at least the surface of which is conductive, the conductive surface functioning as an electrode, an a-Si photoconductive layer overlying the conductive surface, a colorant layer overlying the a-Si photoconductive layer, and one or more electrodes having a predetermined pattern mounted on the colorant layer.

Another preferable embodiment of the photoelectric transducer according to the present invention comprises a substrate at least the surface of which is conductive, the conductive surface functioning as an electrode, an a-Si photoconductive layer overlying the conductive surface, one or more electrodes having a predetermined pattern mounted on the photoconductive layer and a colorant layer covering the whole upper surface of the resulting laminate.

An a-Si photoconductive layer according to the present invention may be produced on a substrate by glow discharge, sputtering, ion plating, reactive electron beam deposition, CVD or the like. The process of production is appropriately selected depending upon the production conditions, desired characteristics of the photoelectric transducer and the like. Glow discharge is preferable because impurities of Group III or V of the Periodic Table can be easily incorporated in the a-Si layer in a substitutional manner for the purpose of controlling the characteristics.

As an impurity for doping an a-Si layer, an element of Group V of the Periodic Table such as N, P, As, Sb, Bi and the like is preferably employed to make the a-Si layer n-type-like while an element of Group III such as B, Al, Ga, In, Tl and the like is preferably employed to make the a-Si layer p-type-like.

Since the content of the impurity is about 1–10,000 atomic ppm, environmental pollution caused by the impurity is less than that caused by the material of the photoconductive layer, but it is still preferable to use an impurity free from environmental pollution as far as possible. From such point of view, B, As, P, Sb and the like are preferable taking into consideration electric and optical characteristics of the a-Si layer to be formed. The amount of the impurity for doping the a-Si layer depends on the electric and optical characteristics to be desired. When the impurity is selected from Group III of the Periodic Table, the atomic ratio of the impurity to the silicon atom is $10^{-6}$–$10^{-2}$, preferably $10^{-5}$–$10^{-4}$. When the impurity is selected from Group V, the atomic ratio of the impurity to the silicon atom is $10^{-6}$–$10^{-4}$, preferably $10^{-5}$–$10^{-4}$.

Thickness of the a-Si photoconductive layer is usually 0.5–10$\mu$, preferably 0.5–1.5$\mu$.

According to the present invention, the a-Si photoconductive layer preferably contains hydrogen atoms.

Hydrogen atom may be incorporated in the a-Si photoconductive layer by introducing hydrogen atom in the form of a silicon compound, for example, silanes such as $SiH_4$, $Si_2H_6$, $Si_3H_8$, $Si_4H_{10}$ and the like into a deposition chamber upon forming the layer and decomposing the silicon compound by glow discharge decomposition to incorporate hydrogen atom in the a-Si photoconductive layer as the layer grows.

In the above process, hydrogen gas may be introduced together with the silicon compound.

According to a reactive sputtering process, when sputtering is carried out in an inert gas such as He, Ar and the like or in a gas mixture atmosphere containing such inert gas as a base component by using silicon as a target, there is introduced hydrogen gas, or a silicon hydride gas such as $SiH_4$, $Si_2H_6$, $Si_3H_8$, $Si_4H_4$ and the like, or $B_2H_6$, $PH_3$ or the like gas which also serves as a dopant source.

The hydrogen content in the a-Si photoconductive layer is a very important factor to affect practicability of the resulting photoelectric transducer.

According to the present invention, the photoconductive layer preferably contains 1–40 atomic %, more preferably 5–30 atomic % of hydrogen so as to make the photoelectric transducer sufficiently practicable.

The substrate may be either electrically conductive or insulating. The applicable conductive substrates include metals and alloys such as NiCr, stainless steel, Al, Cr, Mo, Au, Nb, Ta, V, Ti, Pt, Pd, and the like.

The typical insulating substrates usually employed include films or sheets of synthetic resins such as polyesters, polyethylene, polycarbonates, cellulose acetate, polypropylene, poly(vinyl chloride), poly(vinylidene chloride), polystyrene, polyamides, and the like, glass, ceramics, paper, and the like. These insulating substrates preferably have at least one conductivized surface, on which other layers are laid.

For example, conductivity is imparted by coating the substrate surface with a thin film comprising NiCr, Al, Cr, Mo, Au, Ir, Nb, Ta, V, Ti, Pt, Pd, $In_2O_3$, $SnO_2$, $ITO(In_2O_3+SnO_2)$, or the like when the substrate is glass, and with a thin film of metal such as NiCr, Al, Ag, Pb, Zn, Ni, Au, Cr, Mo, Ir, Nb, Ta, V, Ti, Pt, or the like by vacuum deposition, electron beam deposition, sputtering, or foil lamination when the substrate is a film of synthetic resin such as polyesters film and the like.

The typical organic colorants used effectively for the present invention include:

Blue colorants

Suminol Leveling Blue R (supplied by Sumitomo Chemical Co. Ltd.),

Suminol Fast Navy (supplied by Sumitomo Chemical Co. Ltd.),

Patent Blue AF (supplied by BASF),

Acilan Astol B (supplied by FBy.),

Aizen Basic Cyanine 6GH (supplied by Hodogaya Chemical Co. Ltd.),

Methylene Blue FZ (supplied by Sumitomo Chemical Co. Ltd.),

Sevron Blue 2G (supplied by E. I. du Pont de Nemours & Co. Inc.),

Diacryl Supra Blue 5GL (supplied by Mitsubishi Chemical Industrial Ltd.),

Direct Cupper Blue 2B (supplied by Sumitomo Chemical Co. Ltd.),

Durazol Blue 2GN (supplied by I.C.I. Ltd.),

Kayaras Supra Blue BWL (supplied by Nippon Kayaku Co.

Benzo New Blue 5BS (supplied by Bayer),

Nihonthren Blue GCD (supplied by Sumitomo Chemical Co. Ltd.),

Carbonol Blue LBN (supplied by Nippon Kayaku Co. Ltd.),

Indanethrene Blue RS-D (supplied by BASF),

Mitsui Vat Brilliant Blue 4G (supplied by Mitsui-Toatsu Chemicals Inc.),

Sumikaron Blue S-3RF (supplied by Sumitomo Chemical Co. Ltd.),

Terasil Blue BG (supplied by Ciba-Geigy Ltd.),

Latyl Blue BCN (supplied by E. I. du Pont de Nemours & Co. Ltd.),

Kayalon Fast Blue FN (supplied by Nippon Kayaku Co. Ltd).

Cibanone Dark Blue MB (supplied by Ciba-Geigy Ltd.),

Sumitone Fast Blue RS (supplied by Sumitomo Chemical Co. Ltd.),

Mikethrene Blue GCD (supplied by Mitsui-Toatsu Chemicals Inc.), and the like;

Red Colorants

Suminol Fast Red B conc. (supplied by Sumitomo Chemical Co. Ltd.),

Sumiacryl Red N-RL (supplied by Sumitomo Chemical Co.

Aizen Cathilon Phloxine FF (supplied by Hodogaya Chemical Co. Ltd.),

Direct Scarlet BA (supplied by Sumitomo Chemical Co. Ltd.),

Chlorazol Red Bk (supplied by I. C. I. Ltd.),

Benzo Rubine 6BS (supplied by FBy.),

Mitsui Direct Scarlet 3BX (supplied by Mitsui-Toatsu Chemical Inc.),

Nihonthrene Red FBB (supplied by Sumitomo Chemical Co. Ltd.),

Cibanone Brilliant Pink R (supplied by Ciba-Geigy Ltd.),

Sumikaron Red S-GG (supplied by Sumitomo Chemical Co. Ltd.),

Diacelliton Red R (supplied by Mitsubishi Chemical Industrial Ltd.),

Lurafix Red BF (supplied by BASF),

Cibacet Red 2G (supplied by Ciba-Geigy Ltd.),

Kayalon Fast Scarlet B (supplied by Nippon Kayaku Co. Ltd.),

Sumitone Carmine B (supplied by Sumitomo Chemical Co. Ltd.),

Dainichi 930 Fast Red (supplied by Dainichi Seika),

Chromophthal Red 2RF (supplied by Ciba-Geigy Ltd.),

Sinquasia Red Y (supplied by E. I. du Pont de Nemours & Co. Ltd.),

No. 601 Deep Red Violet (supplied by Toyo Ink Co. Ltd.), and the like;

Green Colorants

Suminol Milling Brilliant Green 5G (supplied by Sumitomo Chemical Co. Ltd.),

Acilan Green SFG (supplied by FBy.),

Diacid Fast Green GW (supplied by Mitsubishi Chemical Industrial Ltd.),

Erio Green SN (supplied by Ciba-Geigy Ltd.),

Aizen Diamond Green GH (supplied by Hodogaya Chemical Co. Ltd.),

Astra Malachite Green B (supplied by FBy.),

Sumiacryl Brilliant Green B (supplied by Sumitomo Chemical Co. Ltd.),

Aizen Direct Green BH (supplied by Hodogaya Chemical Co. Ltd.),
Mitsui Direct Green GC (supplied by Mitsui-Toatsu Chemical Inc.),
Durazol Green 5B (supplied by I. C. I.),
Benzamin Fast Green GFL (supplied by FBy.),
Nihonthrene Brilliant Green B (supplied by Sumitomo Chemical Co. Ltd.),
Mikethrene Brilliant Green GG (supplied by Mitsui-Toatsu Chemical Inc.),
Resolin Green C-FGS (supplied by FBy.),
Dainichi Cyanine Green FG (supplied by Dainichi Seika Co. Ltd.),
Sumitone Fast Green-Yellow 5G (supplied by Sumitomo Chemical Co. Ltd.),
Cyanine Green Toner (supplied by Toyo Ink. Co. Ltd.), and the like;

Yellow Colorants

Suminol Milling Yellow 0 (supplied by Sumitomo Chemical Co. Ltd.),
Acilan Yellow GG (supplied by FBy.),
Palatine Fast Yellow GRN (supplied by BASF),
Fluoresceine SP (supplied by I. C. I.),
Mitsui Metanil Yellow (supplied by Mitsui-Toatsu Chemical Inc.),
Sumiacryl Yellow N-3RL (supplied by Sumitomo Chemical Co. Ltd.),
Celliton Fast Yellow G (supplied by BASF),
Kayalon Fast Yellow GL (supplied by Nippon Kayaku Co. Ltd.),
Aizen Cathilon Yellow 3GLH (supplied by Hodogaya Chemical Co. Ltd.),
Maxilon Yellow 5GL (supplied by Ciba-Geigy Ltd.),
Chrysophenine (supplied by Sumitomo Chemical Co. Ltd.),
Chlorazol Yellow 3G (supplied by I. C. I.),
Stilbene Yellow GX (supplied by E. I. du Pont de Nemours & Co. Ltd.),
Mitsui Direct Fast Yellow BC (supplied by Mitsui-Toatsu Chemical Inc.),
Benzo Viscose Yellow RL (supplied by FBy.),
Nihonthrene Yellow 3GC (supplied by Sumitomo Chemical Co Ltd.),
Cibanon Yellow GC (supplied by Ciba-Geigy Ltd.),
Sumikaron Yellow S-R (supplied by Sumitomo Chemical Co. Ltd.),
Celliton Fast Yellow G (supplied by BASF),
Terasil Golden Yellow RL (supplied by Ciba-Geigy Ltd.),
Miketon Fast Yellow GL (supplied by Mitsui-Toatsu Chemical Inc.),
Dainichi Fast Yellow G (supplied by Dainichi-Seika Co. Ltd.),
Chromophthal Yellow A2R (supplied by Ciba-Geigy Ltd.),
Paliogen Yellow RT (supplied by BASF), and the like;

Magenta Colorants

Solar Acid Scarlet BA (supplied by Sumitomo Chemical Co. Ltd.),
Acilan Scarlet V3R (supplied by FBy.),
Aizen Acid Rhodamine BH (supplied by Hodogaya chemical Co. Ltd.),
Erioshin Scarlet 4R (supplied by Ciba-Geigy Ltd.),
Rhodamine 6G (supplied by Ciba-Geigy Ltd.),
Rhodamine F4G (supplied by BASF),
Kayaku Direct Fast Scarlet 4BS (supplied by Nippon Kayaku Co. Ltd.), and the like;

Cyanine Colorants 2, 3-Dimethyl-quinoxaline,
2-Hydroxy-3-amino-phenazine,
Hydroxy-amino-naphthazine sulfonic acid, and the like.

Additionally, the typical colorants used for the vapor-deposition film process and the heat transfer process include:

Blue Colorants

Orient Soluble Blue OBC (supplied by Orient Chemical Co. Ltd.),
Suminol Leveling Blue 4GL (supplied by Sumitomo Co. Ltd.),
Kayanol Blue N2G (supplied by Nippon Kayaku Co. Ltd.),
Mitsui Alizarine Saphirol B (supplied by Mitsui-Toatsu Chemicals Inc.),
Xylene Fast Blue BL 200% (supplied by Mitsubishi Chemical Industrial Co. Ltd.),
Alizarine Fast Blue R (supplied by Ciba-Geigy Ltd.),
Carbolan Brilliant Blue 2R (supplied by I. C. I. Ltd.),
Palatine Fast Blue GGN (supplied by BASF),
Aizen Opal Blue New conc. (supplied by Hodogaya Chemical Co. Ltd.),
Fastogen Blue SBL (supplied by Dainihon Ink chemical Co. Ltd.), and the like;

Red Colorants

Suminol Fast Red B conc. (supplied by Sumitomo Chemical Co. Ltd.),
Aizen Brilliant Scarlet 3RH (supplied by Hodogaya Chemical Co. Ltd.),
Azo Rubinol 3GS 250% (supplied by Mitsubishi Chemical Industrial Ltd.),
Kayaku Acid Rhodamine FB (supplied by Nippon Kayaku Co. Ltd.),
Acid Anthracene Red 3B (supplied by Chuhgai Chemical Co. Ltd.),
Benzil Fast Red B (supplied by Ciba-Geigy Ltd.),
Palatine Fast Red RN (supplied by BASF),
Nylomine Red 2BS (supplied by I.C.I. Ltd.),
Lanafast Red 2GL (supplied by Mitsui-Toatsu Chemicals Inc.),
Rose Bengal (supplied by Kii Chemical Industry Ltd.), and the like,

Green Colorants

Kayakalan Blue-Black 3BL (supplied by Nippon Kayaku Co. Ltd.),
Sumilan Green BL (supplied by Sumitomo Chemical Co. Ltd.),
Aizen Floslan Olive Green GLH (supplied by Hodogaya Chemical Co. Ltd.),
Diacid Cyanine Green GWA (supplied by Mitsubishi Chemical Industrial Ltd.),
Cibalan Green GL (supplied by Ciba-Geigy Ltd.),
Carbolan Brilliant Green 5G (supplied by I.C.I. Ltd.),
Palatine Fast Green BLN (supplied by BASF),
Acid Green GBH (supplied by Takaoka Chemical Co. Ltd.),
Acid Brilliant Milling Green B (supplied by Mitsui-Toatsu Chemicals Inc.), and the like;

Magenta Colorants

Rhodamine 6GCP (supplied by Sumitomo Chemical Co. Ltd.),

Rhodamine F4G (supplied by BASF),

Phloxine G (supplied by FBy.),

Kayacet Red B (supplied by Nippon Kayaku Co. Ltd.),

PTR-63 (supplied by Mitsubishi Chemical Industrial Ltd.), and the like dyes, and Pigments of perylene-type, quinacridone-type, and anthraquinone;

Cyanine Colorants

Primo Cyanine BX conc. (supplied by Sumitomo Chemical Co. Ltd.),

Astrazon Blue B (supplied by FBy.),

Aizen Basic Cyanine 6GH (supplied by Hodogaya Chemical Co. Ltd.), and the like dyes, and Phthalocyanine pigments such as cupper-phthalocyanines and the like;

Yellow Colorants

Fast Yellow G (supplied by BASF),

Brilliant Yellow 5G (supplied by Hodogaya Chemical Co. Ltd.),

Brilliant Yellow 5GH (supplied by Hodogaya Chemical Co. Ltd.),

Kayacet Yellow 963 (supplied by Nippon Kayaku Co. Ltd.), and the like dyes, and

Pigments such as flavanthrone type, isoindoline type, and the like.

In the present invention, each colorant as described above may be used singly or in combination. In application of the colorant there may be effectively used a method of thinly coating the colorant to the a-Si layer formed on the substrate, a method of thermally transferring a dye having good sublimation property onto the area to be colored by bringing the dye close to or into contact with the area followed by heating of the dye, a method of vapor-depositing in a vacuum a dye or pigment which is low in the vapor pressure and hardly susceptible to thermal decoposition, onto the a-Si layer formed on the substrate to form a film of the dye or pigment, and the like. The last described method, i.e. vapor deposition method is the easiest in controlling the thickness of the film.

The vapor deposition film of the dye or pigment may be formed while the vacuum degree of the deposition chamber is adjusted to $10^{-4}$–$10^{-6}$ Torr and the heating temperature for the substrate is controlled in the range of 200°–600° C. The thickness of film is preferably 0.1–10$\mu$, more preferably 0.2–1$\mu$.

It can be considered that the spectral sensitization of the a-Si photoconductive layer with the colorant which is achieved in the present invention is different from the mechanism for the colorant sensitization of AgX, ZnO, CdS or the like which has been known in the past. More specifically, it is well known that for example, AgX is allowed to adsorb various colorants so that the spectral sensitization takes place in the region of longer wavelength. This indicates that the photosensitive wavelength region is obtained in the region of longer wavelength exceeding the photosensitive wavelength region of AgX by adsorption of the colorant. This is also applicable to ZnO and CdS.

However, in the spectral sensitization of the present invention, the sensitization in the region of long wavelength lies on the extension line of the conventional technique while spectral sensitization region of a significant degree is selectively provided in the region of short wavelength.

The spectral sensitization of the present invention is further explained by the following fact.

(1) The a-Si film has the maximum of spectral sensitivity at a wavelength of 600 nm and exhibits sensitivity in the broad wavelength range covering the short wavelength region to the near-infrared region.

(2) The colorant layer used in the present invention is formed effectively of a photoconductive colorant which gets light absorption peculiar to the colorant and exhibits photoconductivity, but not of an insulating colorant or non-photoconductive colorant as generally recognized.

Detailed mechanism for the spectral sensitization is not clear, but is considered to be different from that for the conventional spectral sensitization of for example AgX.

Figure 6:
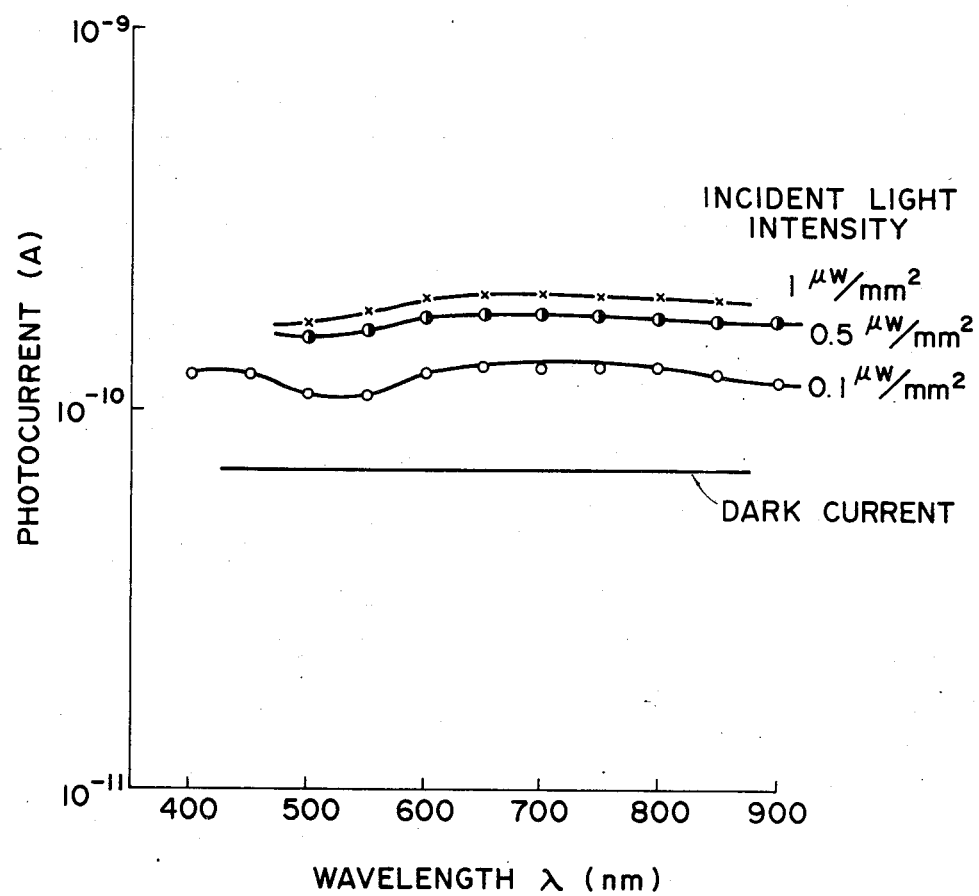

The photoconduction of the colorant layer is explained with reference to the characteristic of the vapor deposition film of Pb-phthalocyanine in FIG. 6. This drawing shows results measured for a sample which was prepared in such a manner that a Pb-phthalocyanine film of 0.4 $\mu$m thickness was formed on a glass substrate by the vapor deposition carried out at a vacuum degree of $10^{-4}$–$10^{-5}$ Torr and then electrodes of 1400 Å thickness were made up of aluminum. The measurement was carried out while the applied voltage was controlled to 10 V and the incident light intensity was varied in the range of 0.1–1 $\mu$W/mm$^2$. It is found from the experimental results that the dark current was $7 \times 10^{-11}$ ampere, and the photo-current was $1.3 \times 10^{-10}$ ampere when the incident light intensity was 0.1 $\mu$W/mm$^2$ and therefore that the colorant layer had photoconductivity.

This fact shows that in the present invention the spectral sensitivity wavelength of the a-Si layer can be controlled to the optional sensitivity width by selecting the colorant exhibiting photoconductivity.

Further, the colorant layer as described above can be combined with an a-Si layer having good photosensitivity or polycrystalline Si layer to prepare a three colors-separation photosensor which can be applied also to a photodetector device for the color TV.

EXAMPLE 1

The semiconductor photoelectric transducer of the present invention was prepared by using an apparatus as shown in FIG. 3 in the manner described below. The structure of the transducer is illustrated in FIG. 1, in which numeral 6 denotes the whole structure of the transducer, 7 electrodes, 8 a colorant layer, 9 an a-Si layer, and 11 a substrate.

A glass substrate 11, the surface of which had been made electrically conductive and cleaned, was fixed at a predetermined position of a fixing member 12 disposed at a predetermined position in a deposition chamber 10 for glow discharge so that the substrate might be kept apart from a heater 13 equipped to the fixing member 12 by about 10 cm. Then, the air in the deposition chamber 10 was evacuated by opening fully a main valve 29 to bring its vacuum degree to about $5 \times 10^{-6}$ Torr. The heater 13 was turned on to heat uniformly the glass plate to 150° C., and the substrate was kept at this temperature. An auxiliary valve 28 was fully opened, and successively a needle valve 22 for a bomb 16 and a needle valve 23 for a bomb 17 were fully opened. Thereafter, flow controlling valves 25 and 26 were gradually opened to introduce Ar gas from the bomb 16 and SiH$_4$ gas from the bomb 17 into the deposition chamber 10. At that time, the main valve 29 was controlled to retain the inside of the deposition chamber 10 at a vacuum degree of about 0.75 Torr.

After stabilization of the gas flow had been confirmed by means of flow meters 19 and 20, a high frequency power source 14 was switched on to apply a high frequency of 13.56 MHz between electrodes 15 and 15′ so that a glow discharge was caused to form an a-Si layer 9 on the glass substrate. At that time, the electric current for the glow discharge was about 1 mA/cm$^2$, and the voltage 0.5 KV. Further, the growth rate of the a-Si layer was about 1 Å/sec, and the deposition was carried out for 4 hours to form an a-Si layer having a thickness of 1.4μ.

After completion of the deposition, the main valve 29, flow controlling valves 25 and 26, and needle valves 22 and 23 were all closed, and instead, the valve 30 was opened to break the vacuum state in the deposition chamber 10. The structure having the a-Si layer thereon was then taken out.

Subsequently, a colorant layer 8 was formed by the deposition procedure using a conventional resistance heating type vapor deposition apparatus. Specifically, a vapor deposition layer of Pb-phthalocyanine was formed under the conditions that the vacuum degree was $10^{-4}$–$10^{-6}$ Torr and heating temperature 500° C. The layer was 0.2 μm in thickness.

Further, electrodes 7 for obtaining output of the photoelectric transducer were made up of aluminum. As a result, the semiconductor photoelectric transducer 6 having the structure as shown in FIG. 1 was obtained.

Figure 4:
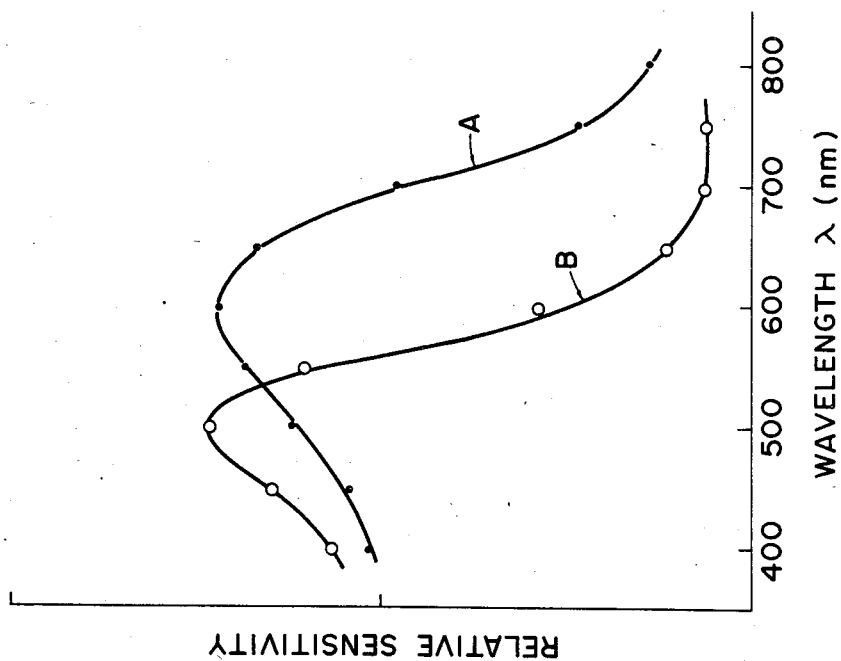

The spectral sensitivity characteristic of the semiconductor photoelectric transducer thus prepared is shown in FIG. 4, and its curve is denoted by the symbol "B" in the drawing. The spectral sensitivity of the conventional a-Si photoelectric transducer is shown by "A" in the same drawing. The conventional a-Si photoelectric transducer had broad spectral sensitivity over the whole wavelength in the visible region and possesses the maximum photoconductivity at a wavelength of 600 nm. In contrast, the a-Si photoelectric transducer which received the spectral sensitization with Pb-phthalocyanine had the maximum photoconductivity at 500 nm so that a green sensitive a-Si photoelectric transducer could be provided.

The green sensitive a-Si photoelectric transducer of this example was measured with respect to the photocurrent and dark current. It was found that it had the maximum photocurrent of $4.4 \times 10^{-7}$(A) when the incident light intensity was 1 μW/mm$^2$ and the applied voltage was 10 V while it was $1.5 \times 10^{-8}$(A) when no light was irradiated, i.e. in the dark current. The sensitivity for photoconductivity is 29.3 when expressed in terms of the ratio of the photocurrent to the dark current. Further, the sensitivity for photoconductivity of the a-Si layer which is not yet subjected to the spectral sensitization is 27.1. As a result, it was recognized that carrier was injected from the Pb-phthalocyanine layer to the a-Si layer.

EXAMPLE 2

In this example, a layer of Cu-phthalocyanine was formed on the a-Si layer which had been formed by repeating the same procedure as in Example 1, by the vapor deposition in order to prepare a blue sensitive a-Si photoelectric transducer. The vapor deposition of Cu-phthalocyanine was carried out under the conditions that the vacuum degree was $10^{-5}$–$10^{-6}$ Torr and the heating temperature was 500° C. The vapor deposition layer was 0.2 μm in thickness.

Further, electrodes for obtaining the output of the photoelectric transducer were made up of aluminum.

The spectral sensitivity characteristic of the semiconductor photoelectric transducer thus obtained is shown by the symbol "C" in FIG. 5. The a-Si photoelectric transducer having been subjected to the spectral sensitization with Cu-phthalocyanine had the maximum photoconductivity at 470 nm so that a blue sensitive a-Si photoelectric transducer could be prepared.

It was further found that the transducer had a dark conductivity of $2 \times 10^{-8}(\Omega cm)^{-1}$ and a photo-conductivity of $4 \times 10^{-8}(\Omega cm)^{-1}$.

EXAMPLE 3

Dyeing of rhodamine 6G, the colorant concentration of which had been controlled to $10^{-4}$ mol/l (alcohol solution), was carried out on the a-Si layer which had been formed by the same procedure as in Example 1. That is, the a-Si layer was allowed to adsorb the colorant molecule. Then, vapor deposition of aluminum was conducted to form electrodes. In addition, the colorant layer was about 1μ in thickness.

The a-Si photoelectric transducer which was spectral-sensitized with the rhodamine had the maximum photoconductivity at 620 nm so that a red sensitive a-Si photo electric transducer could be prepared.

EXAMPLE 4

In this example, a photoelectric transducer of the structure as illustrated in FIG. 2 was prepared. In the drawing, numerals 7, 8, 9 and 11 denote, respectively, the same components as explained in connection to FIG. 1.

Electrodes of aluminum were fabricated on the a-Si layer which had been formed by the same procedure as in Example 1, by the vapor deposition.

Next, a vapor deposition film of Cu-phthalocyanine which was a sublimable dye was formed on a glass as the substrate. The vapor deposition of Cu-phthalocyanine was carried out at a vacuum degree of $10^{-5}$ Torr and a heating temperature of 500° C. The vapor deposition film had a thickness of 0.3 microns and assumed a deep blue color.

The Cu-phthalocyanine film on the glass substrate was brought into close contact with the a-Si layer and scanned with a He-Ne laser having an output of 0.5 mW so that thermal transferring of the Cu-phthalocyanine was achieved by means of the heat generated. As a result, a spectral-sensitized photoelectric transducer of the structure as shown in FIG. 2 was prepared.

What is claimed is:

1. A photosensitive transducer which comprises, in sequence, a substrate, a photoconductive amorphous silicon layer and a colorant layer comprising a photoconductive dye or pigment adapted to provide said amorphous silicon layer with enhanced photoconductivity and modified spectral sensitivity.

2. A photoelectric transducer according to claim 1 in which the photoconductive layer and the colorant layer are sandwiched between a pair of electrodes.

3. A photoelectric transducer according to claim 1 in which the photoconductive layer contains hydrogen atoms.

4. A photoelectric transducer according to claim 3 in which the photoconductive layer contains 1–40 atomic percent of hydrogen.

* * * * *

UNITED STATES PATENT AND TRADEMARK OFFICE
CERTIFICATE OF CORRECTION

PATENT NO. : 4,682,019

DATED : July 21, 1987

INVENTOR(S) : HISASHI NAKATSUI, ET AL.

It is certified that error appears in the above-identified patent and that said Letters Patent is hereby corrected as shown below:

AT [63] UNDER RELATED U.S. APPLICATION DATA

Line 1, "Ser. No. 735,511," should read --Ser. No. 736,511,--.

COLUMN 1

Lines 6-7, "Ser. No. 735,511" should read --Ser. No. 736,511--.
Line 39, "of Group IV" should read --elements of Group IV--.
Line 50, "tens minutes" should read --tens of minutes--.

COLUMN 2

Line 1, "DRAWING" should read --DRAWINGS--.

COLUMN 3

Line 43, "polyesters film" should read --polyester films--.
Line 67, "Co. " should read --Co. Ltd.),--.

COLUMN 4

Line 14, "Ltd)." should read --Ltd.),--.
Line 26, "Co." should read --Co. Ltd.),--.

UNITED STATES PATENT AND TRADEMARK OFFICE
CERTIFICATE OF CORRECTION

PATENT NO. : 4,682,019

DATED : July 21, 1987

INVENTOR(S) : HISASHI NAKATSUI, ET AL.

It is certified that error appears in the above-identified patent and that said Letters Patent is hereby corrected as shown below:

COLUMN 8

Line 19,   "for example" should read --, for example,--.
    Line 44,   "three colors-" should read --three-color--.

COLUMN 9

Line 65,   "the" should be deleted. (2nd occurrence)

COLUMN 10

Line 28,   "photo electric" should read --photoelectric--.
    Line 38,   "the" should be deleted.--.

Signed and Sealed this

Twenty-sixth Day of January, 1988

Attest:

DONALD J. QUIGG

Attesting Officer           Commissioner of Patents and Trademarks